(12) United States Patent
Diedrichs et al.

(10) Patent No.: US 11,937,412 B2
(45) Date of Patent: Mar. 19, 2024

(54) ARRANGEMENT FOR COOLING POWER SEMICONDUCTOR DEVICES OF A CONVERTER

(71) Applicant: BOMBARDIER TRANSPORTATION GMBH, Berlin (DE)

(72) Inventors: Ben Diedrichs, Sundbyberg (SE); Tommy Randow, Västerås (SE)

(73) Assignee: BOMBARDIER TRANSPORTATION GMBH, Berlin (DE)

( * ) Notice: Subject to any disclaimer, the term of this patent is extended or adjusted under 35 U.S.C. 154(b) by 209 days.

(21) Appl. No.: 17/415,352

(22) PCT Filed: Dec. 6, 2019

(86) PCT No.: PCT/EP2019/083977
§ 371 (c)(1),
(2) Date: Jun. 17, 2021

(87) PCT Pub. No.: WO2020/126547
PCT Pub. Date: Jun. 25, 2020

(65) Prior Publication Data
US 2022/0071065 A1    Mar. 3, 2022

(30) Foreign Application Priority Data
Dec. 18, 2018    (SE) .................................. 1851601-3

(51) Int. Cl.
*H05K 7/20*    (2006.01)
*H01L 23/467*    (2006.01)

(52) U.S. Cl.
CPC ....... *H05K 7/20918* (2013.01); *H01L 23/467* (2013.01)

(58) Field of Classification Search
CPC .......... H05K 7/20918; H05K 7/20181; H05K 7/20154; H05K 7/20172; H05K 7/20145; H05K 7/20972; H01L 23/467; G06F 1/20
See application file for complete search history.

(56) References Cited

U.S. PATENT DOCUMENTS 8,813,832 B2 *   8/2014   Miki ...................... H05K 7/209
                                                  165/184
9,862,302 B2 *   1/2018   Kuo ...................... F21S 41/153
(Continued)

FOREIGN PATENT DOCUMENTS

EP    0794098 A1    9/1997
EP    2950625 A1    12/2015
(Continued)

*Primary Examiner* — Mandeep S Buttar
(74) *Attorney, Agent, or Firm* — Dilworth & Barrese, LLP

(57) ABSTRACT

An arrangement for cooling power semiconductor devices (2) of a converter (1) arranged in a closed casing (3) with the semiconductor devices in a bottom of the casing on top of a heat sink (5) having members (6) for heat exchange extending externally of the casing out from the bottom comprises a channel (8) for conducting a flow of air to pass said members (6) for cooling thereof, in which a first portion (7) of the channel has the casing bottom as a ceiling and receiving said members (6). A fan (9) is located with a suction side connected to the first channel portion (7) to create a flow of air from an inlet (16) from the exterior (19) into the channel while passing the heat sink members. A filter (18) covers the inlet to the channel for removal of dust and debris from air entering the channel from the exterior.

14 Claims, 2 Drawing Sheets

(56) References Cited

U.S. PATENT DOCUMENTS

| | | | |
|---|---|---|---|
| 10,470,343 B2* | 11/2019 | Shibata | H05K 7/20909 |
| 2006/0268515 A1* | 11/2006 | Hong | H05K 7/20172 |
| | | | 361/695 |
| 2007/0297134 A1* | 12/2007 | Lanni | H05K 7/20209 |
| | | | 361/695 |
| 2015/0003859 A1* | 1/2015 | Tanida | G03G 21/206 |
| | | | 399/92 |
| 2016/0091264 A1 | 3/2016 | Lu et al. | |
| 2016/0270254 A1 | 9/2016 | Brianese | |
| 2016/0356288 A1* | 12/2016 | Schrand | F04D 29/282 |
| 2017/0174041 A1* | 6/2017 | Feltham | B60H 1/00564 |
| 2017/0238441 A1* | 8/2017 | Kaneko | H05K 7/209 |
| | | | 361/710 |
| 2017/0303430 A1* | 10/2017 | Enami | B61C 3/00 |
| 2017/0341521 A1* | 11/2017 | Kaneko | B60L 3/003 |
| 2018/0310431 A1* | 10/2018 | Kamiya | B61D 27/0072 |
| 2019/0230799 A1* | 7/2019 | Chiu | H05K 7/20136 |
| 2020/0187389 A1* | 6/2020 | Yano | H05K 7/20145 |

FOREIGN PATENT DOCUMENTS

| | | |
|---|---|---|
| GB | 2534013 A | 7/2016 |
| WO | 2018/020615 A1 | 2/2018 |

* cited by examiner

ARRANGEMENT FOR COOLING POWER SEMICONDUCTOR DEVICES OF A CONVERTER

TECHNICAL FIELD OF THE INVENTION AND BACKGROUND ART

The present invention relates to an arrangement for cooling power semiconductor devices of a converter arranged in a closed casing with said semiconductor devices in a bottom of the casing on top of a heat sink having members, such as fins, for heat exchange extending externally of the casing out from the bottom, the arrangement comprising:
- a channel for conducting a flow of air to pass said members for cooling thereof, in which a first portion of said channel has the casing bottom as a ceiling and receiving said members,
- a fan located with a suction side connected to said first channel portion to create a flow of air from an inlet from the exterior into said channel while passing the heat sink members, and
- a filter covering said inlet to the channel for removal of dust and debris from air entering the channel from the exterior.

The invention is not restricted to any particular field of use of a said converter, but the use thereof in a railway vehicle, such as in the form of line converters, motor converters and auxiliary converters, will in some parts of this disclosure be discussed for illuminating the invention but accordingly not restrict the invention thereto.

The power semiconductor devices may for example be IGBTs or MOSFETs. The converter is enclosed in a said casing for protecting the components thereof against dust and debris. This casing will then also contain electronic equipment among other used for the control of the converter. This content of the casing generates waste heat that needs to be rejected out of the casing, which for the heat generated by the power semiconductor devices is mainly obtained by conducting a flow of air to pass the members of the heat sink upon which the semiconductor devices of the converter are arranged. Known arrangements of the type defined in the introduction for cooling the power semiconductor devices through such an air flow do not operate as efficiently as desired, and in case of being on board a railway vehicle there is not only a problem with an increased consumption of energy would it be tried to increase the power of the fan for improving the cooling, but that measure is only possible to a certain degree because too powerful and disturbing noise would otherwise be generated by the operation of the fan.

SUMMARY OF THE INVENTION

The object of the present invention is to provide an arrangement of the type defined in the introduction addressing the problem mentioned above of such arrangements already known.

This object is according to the invention obtained by providing such an arrangement with the features listed herein.

Thus, the channel is provided with a second portion connected to the first portion as seen in the direction of the air flow through the channel upstreams of the first portion and the second channel portion extends along and has as a delimiting wall a lateral wall of the casing connecting to the bottom thereof to conduct air downwards along this lateral casing wall to enter the first channel portion. Furthermore, the channel inlet is located in the second channel portion opposite to the lateral casing wall and has a longitudinal extension in the direction of the extension of this channel portion to the region of the start of the first channel portion. This way of arranging the inlet makes it possible to obtain a large area of the channel inlet, so that the speed of the air therethrough will not exceed the maximum speed of air through the filter media allowable for ensuring that dust and debris are not drawn through the filter and resulting in a low air pressure drop through the filter and by that a maximum flow obtainable through the operation of the fan through the channel. Additionally, the channel inlet is designed to form a resistance to flow of air therethrough through the filter and into the second channel portion increasing in the direction towards said first channel portion so as to in this direction increase the air pressure difference between the exterior and the inner of the second channel portion and by that reduce the air flow into the second channel portion. It is by this possible to generate a linear vertical pressure drop in the second channel portion resulting in a uniform speed of the air inside the channel, which besides a maximized air flow therethrough will result in an efficient cooling of said member of the heat sink and by that of the semiconductor devices of the converter.

According to an embodiment of the invention the channel inlet is designed to form a said resistance to flow of air through the inlet through the filter into the second channel portion to generate a linear or substantially linear pressure drop in the second channel portion in the direction towards the start of the first channel portion. As mentioned, this will result in a uniform flow of air through the second channel portion and by that along and past said members, such as fins, of the heat sink optimizing the cooling thereof.

According to another embodiment of the invention the channel inlet comprises an air-impermeable channel wall member having the filter internally thereof and provided with through-holes for air to pass, and the total area of the through-holes in subsequent sections of the second channel portion decreases the closer the section is to the start of the first channel portion. This constitutes one advantageous way of obtaining a preferred pressure drop in the extension of the second channel portion. According to another embodiment of the invention the area of individual said through-holes decreases in the direction towards the start of said first channel portion for obtaining this.

According to another embodiment of the invention the filter is designed to provide a resistance to flow of air therethrough increasing in the direction towards the start of the first channel portion.

According to another embodiment of the invention the channel inlet also comprises at least one opening into the channel in the region of the start of the first channel portion from below to create a flow of air into the region of a junction of the second channel portion to the first channel portion from below. Such a position of at least one opening of the channel inlet contributes to making the air flow in the first channel portion uniform, i.e. with the same speed, over the cross-section of the first channel portion resulting in an optimum cooling of said members of the heat sink.

According to another embodiment of the invention the second channel portion has a cross-section increasing in the direction of the extension towards the first channel portion. This makes it possible to increase the filter area and by that fully utilize the performance of the fan and is also favourable for obtaining a uniform speed of the air flow in the second channel portion and by that also in the first channel portion.

According to another embodiment of the invention the filter is diverging away from the lateral casing wall in the direction of the extension of the second channel portion towards the first channel portion, through which the filter area may increase.

According to another embodiment of the invention the arrangement comprises an air-to-air heat exchanger with surfaces covering said lateral casing wall and forming a wall part of the second channel portion heated by a flow of air heated by components inside the casing and to be cooled by air flowing downwards therealong in the second channel portion. The linear or nearly linear vertical pressure drop in the second channel portion and the uniform flow therein resulting therefrom will result in a uniform efficient cooling of said surfaces of the heat exchanger to remove heat generated by electronics inside the casing from the casing.

According to another embodiment of the invention the fan is provided with an inlet cone arranged to allow air to be drawn all around the inlet of the cone into the fan. Such an inlet cone will positively influence the maximum flow of air through the channel obtainable through the operation of the fan.

According to another embodiment of the invention the fan is arranged with said inlet cone being symmetrical with respect to a vertical axis to obtain an air flow vertically, such as from below, into the fan, and the channel has a third channel portion connecting to the first channel portion while changing direction of the channel by 90° or substantially 90° while forming said inlet cone. Such an arrangement of the fan in combination with a said inlet cone is advantageous. In the case of having the arrangement in a railway vehicle, in which the converter casing may be arranged under the car body, an arrangement of the fan to have an air flow vertically from below into the fan, will be advantageous for considering the reduced space available.

According to another embodiment of the invention the arrangement is configured to cool power semiconductor devices of two said converters arranged in a said casing each and having a said channel with a said inlet each, and the two channels have a said fan in common with the casings arranged on opposite sides of the fan to have first channel portions reaching the inlet cone of the fan from opposite directions so as to draw air all around the inlet cone into the fan. Such a positioning of the fan and having one fan for obtaining cooling of the power semiconductor devices of both converters results in a maximized air flow through the fan by the uniform air flow into the inlet thereof and by that a possibility to use only one fan of a certain rating and still obtain sufficient cooling of the semiconductor devices of two converters.

The invention also relates to a use of an arrangement according to the invention for cooling power semiconductor devices of a converter in a railway vehicle, in which the arrangement according to an embodiment thereof is mounted under the car body of a railway vehicle. The invention also relates to a railway vehicle provided with an arrangement according to the invention.

Further advantages as well as advantageous features of the invention will appear from the description following below.

BRIEF DESCRIPTION OF THE DRAWINGS

With reference to the appended drawings, below follows a specific description of an embodiment of the invention cited as an example.

In the drawings.

DETAILED DESCRIPTION OF AN EMBODIMENT OF THE INVENTION

Figure 1:
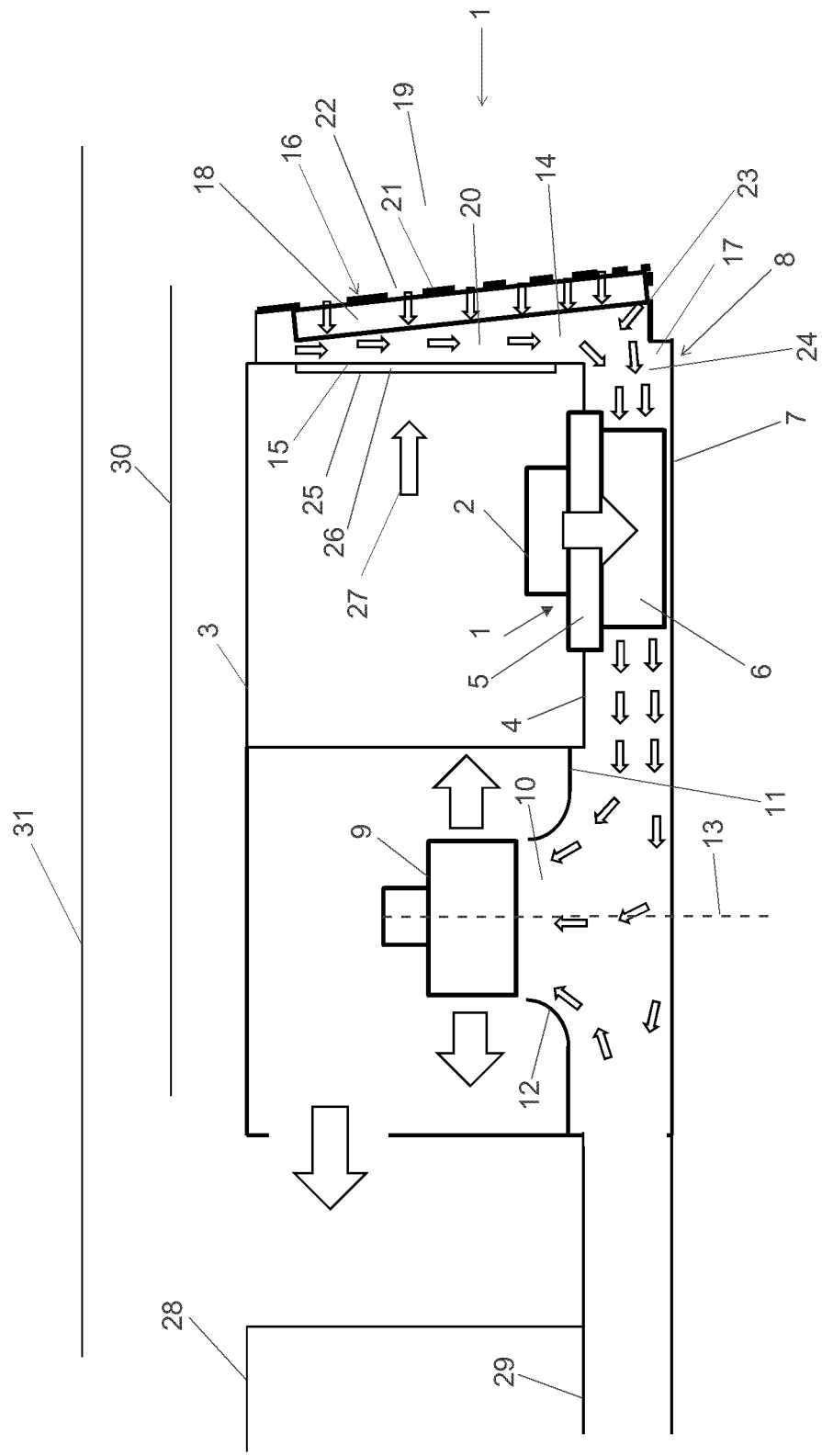
FIG. 1 is a very schematic view illustrating the general construction of an arrangement for cooling power semiconductor devices of a converter according to an embodiment of the invention.

It is shown in FIG. 1 how a converter 1 having power semiconductor devices 2 illustrated by a box are arranged in a closed casing 3 in the form of a so-called converter box. The semiconductor devices, which are for instance IGBTs or MOSFETs, are arranged in the bottom 4 of the casing on top of a heat sink 5 having fins 6 for heat exchange extending externally of the casing down from the bottom 4 into a first portion 7 of a channel 8 for conducting a flow of air to pass the fins. This first channel portion has the casing bottom (partly provided by the heat sink) as a ceiling.

A fan 9 is arranged with a suction side 10 connected to the first channel portion 7 through a third channel portion 11 being a part of an inlet cone 12 of the fan, which is symmetrical with respect to a vertical axis 13 to obtain an air flow from below vertically into the fan while changing the direction of the channel by 90° with respect to the direction thereof through the first channel portion 7.

The channel further comprises a second portion 14 connected to the first portion 7 as seen in the direction of the air flow through the channel upstreams of the first portion. This second channel portion extends along and has as a delimiting wall a lateral wall 15 of the casing 3 connecting to the bottom 4 to conduct air downwards along the lateral casing wall to enter the first channel portion 7.

A channel inlet 16 is located in the second channel portion 14 opposite to the lateral casing wall 15 and has a longitudinal extension in the direction of the extension of this channel portion to the region of the start 17 of the first channel portion 7. A filter 18 covers the channel inlet 16 for removal of dust and debris from air entering the channel from the exterior 19.

Figure 2:
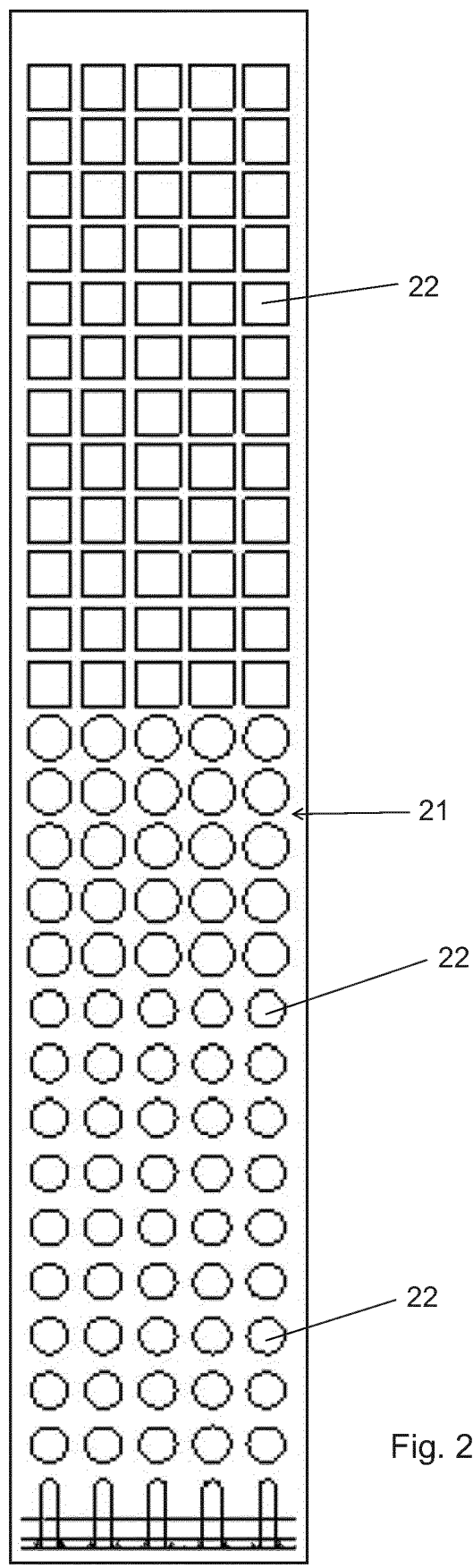
FIG. 2 is a view in the direction of the arrow I in FIG. 1 on the channel inlet of the arrangement shown in FIG. 1.

The channel inlet 16 is designed to form a resistance to flow of air therethrough through the filter 18 and into the second channel portion 14 increasing in the direction towards the first channel portion 7 so as to in this direction increase the air pressure difference between the exterior 19 and the inner 20 of the second channel portion and by that reduce the air flow into the second channel portion the closer the second channel portion comes to the start 17 of the first channel portion. This is obtained by having an air-impermeable channel wall member 21 in the form of a so-called inlet grill arranged outside the filter and provided with through-holes 22 for air to pass and by varying the size of these through-holes to decrease in subsequent sections of the second channel portion the closer the section is to the start 17 of the first channel portion. It is shown in FIG. 2 how the total area of the through-holes 22 in subsequent sections of the second channel portion decreases in the direction towards the first channel portion. This design of the channel inlet will result in a linear vertical pressure drop and uniform flow of air in the second channel portion 14 and by that through the entire channel.

The second channel portion 14 has a cross-section increasing in the direction of the extension thereof towards the first channel portion 7 by having the filter 18 and the channel wall member 21 diverging away from the lateral casing wall 15 in the direction of the extension of the second channel portion towards the first channel portion. This results in a possibility to increase the area of the filter and by that the fan performance without exceeding the maximum speed of air through the filter ensuring that no dust or debris is drawn through the filter.

The channel inlet has also openings 23 into the channel in the region of the start 17 of the first channel portion from below to create a flow of air into the region of the junction 24 of the second channel portion 14 to the first channel portion 7 from below. These openings ensure that the air flow in the first channel portion will be uniform into and about the fins 6 in the vertical direction of the cross-section of the first channel portion.

The converter casing 3 further contains electronics for among others the control of the converter and conducting rails generating power losses in the form of heat, and the casing does for that sake contain an air to air heat exchanger 25 with surfaces 26 covering the lateral casing wall 15 and forming a wall part of the second channel portion heated by a flow of air inside the casing heated by said power loss heat inside the casing to be cooled by air flowing downwards therealong in the second channel portion. A member causing such an air flow inside the heat exchanger 25 is indicated by the arrow 27. The linear vertical pressure drop inside the second channel portion resulting in a constant air flow passing the heat exchanger 25 results in a uniform cooling of the entire surfaces 26 thereof.

It is indicated in FIG. 1 how the casing 28 of a further converter with power semiconductor devices may be arranged to have a corresponding design of channel as shown to the right in FIG. 1 with a first channel portion 29 thereof connecting to the inlet cone 12 of the fan 9, which will then be in common to cooling power semiconductor devices of both converters. This means that the first channel portions 7, 29 will reach the inlet cone 12 of the fan 9 from opposite directions so as to draw air all around the inlet cone into the fan while optimizing the performance of the fan, so that the power rating of the fan will be utilized to full extent for cooling the semiconductor devices of the converters.

It is very schematically indicated how the converter casings with the arrangement for cooling the power semiconductor devices thereof may be mounted under the car body 30 of a railway vehicle 31 where a filter 18 is absolutely necessary for preventing dust and debris from reaching into the channel used for cooling purposes.

The invention is of course in no way restricted to the embodiment described above, since many possibilities for modifications thereof are likely to be obvious to one skilled in the art without having to deviate from the scope of the invention defined in the appended claims.

It is of course possible to incline the entire construction arbitrarily with respect to what is shown in FIG. 1, so that the bottom of the converter casing forming the ceiling of the first channel portion does not extend horizontally or even substantially horizontally, and the wording of this disclosure with respect to orientation of different parts in the space is configured to cover such modifications. For instance may everything be turned upside down, and the bottom of the casing will then be the casing part on the highest level and the heat sink members, such as fins, will then extend upwards out from the bottom. Thus, "bottom" as used in this disclosure is to be interpreted to cover any orientation of that casing part. "Lateral" as used in this disclosure relates to the bottom, so that if the bottom extend vertically said lateral casing wall may extend nearly horizontally. This do then also mean that the definition "being symmetrical with respect to a vertical axis" will then also be met by a said axis being not exactly vertical owing to a tilting of the entire construction.

The invention claimed is:

1. An arrangement for cooling power semiconductor devices (2) of a converter (1) arranged in a closed casing (3) with said semiconductor devices in a bottom (4) of the casing on top of a heat sink (5) having members (6), such as fins, for heat exchange extending externally of the casing out from the bottom, the arrangement comprising:
   a channel (8) for conducting a flow of air to pass said members (6) for cooling thereof, in which a first portion (7) of said channel has the casing bottom (4) as a ceiling and receiving said members,
   a fan (9) located with a suction side connected to said first channel portion (7) to create a flow of air from an inlet (16) from the exterior (19) into said channel while passing the heat sink members (6), and
   a filter (18) covering said inlet (16) to the channel for removal of dust and debris from air entering the channel from the exterior,
   wherein the channel comprises a second portion (14) connected to the first portion (7) in the direction of the air flow through the channel upstream of the first portion,
   the second channel portion (14) extends along a delimiting lateral wall (15) of said casing (3) connecting to said bottom (4) to conduct air downwards along this lateral casing wall to enter the first channel portion (7),
   the channel inlet (16) is located in the second channel portion (14) opposite to said lateral casing wall (15) and has a longitudinal extension in the direction of the extension of this channel portion to the region of the start (17) of the first channel portion (7),
   the channel inlet (16) is designed to form resistance to flow of air therethrough through the filter (18) and into the second channel portion (14) increasing in the direction towards said first channel portion (7) to in this direction increase the air pressure difference between the exterior and the inner of the second channel portion and by that reduce the air flow into the second channel portion (14),
   the channel inlet (16) comprises an air-impermeable channel wall member (21) having the filter (18) internally thereof and provided with through-holes (22) for air to pass, and
   the total area of the through-holes (22) in subsequent sections of the second channel portion (14) decreases the closer the section is to the start (17) of the first channel portion (7).

2. The arrangement according to claim 1, wherein the channel inlet (16) is designed to form resistance to flow of air through the inlet through the filter (18) into the second channel portion (14) to generate a linear or substantially linear pressure drop in the second channel portion in the direction towards the start (17) of the first channel portion (7).

3. The arrangement according to claim 1, wherein the area of individual said through-holes (22) decreases in the direction towards the start (17) of said first channel portion (7).

4. The arrangement according to claim 1, wherein the filter (18) is designed to provide resistance to flow of air therethrough increasing in the direction towards the start of the first channel portion (7).

5. The arrangement according to claim 1, wherein the channel inlet (16) also comprises at least one opening (23) into the channel in the region of the start (17) of the first channel portion (7) from below to create a flow of air into the region of the junction (24) of the second channel portion (14) to the first channel portion (7) from below.

6. The arrangement according to claim 1, wherein the second channel portion (14) has a cross-section increasing in the direction of the extension thereof towards the first channel portion (7).

7. The arrangement according to claim 6, wherein the filter (18) is diverging away from said lateral casing wall (15) in the direction of the extension of the second channel portion (14) towards the first channel portion (7).

8. The arrangement according to claim 1, wherein it comprises an air to air heat exchanger (25) with surfaces (26) covering said lateral casing wall (15) and forming a wall part of the second channel portion (14) heated by a flow of air heated by components inside the casing (3) and to be cooled by air flowing downwards therealong in the second channel portion (14).

9. The arrangement according to claim 1, wherein the fan (9) is provided with an inlet cone (12) arranged to allow air to be drawn all around the inlet of the cone into the fan.

10. The arrangement according to claim 9, wherein the fan (9) is arranged with said inlet cone (12) being symmetrical with respect to a vertical axis (13) to obtain an air flow vertically, such as from below, into the fan, and that the channel (8) has a third channel portion (11) connecting to the first channel portion (7) while changing direction of the channel by 90° or substantially 90° while forming said inlet cone (12).

11. The arrangement according to claim 10, wherein it is configured to cool power semiconductor devices of two said converters arranged in respective casings (3, 28), each said converter having a channel with an inlet, and the two channels have said fan (9) in common with the casings (3, 28) arranged on opposite sides of the fan to have first channel portions (7, 29) reaching the inlet cone (12) of the fan from opposite directions to draw air all around the inlet cone into the fan.

12. A combination of the arrangement according to claim 1 for cooling power semiconductor devices (2) of a converter (1) in a railway vehicle (31).

13. The combination according to claim 12, wherein the arrangement is mounted under a car body (30) of the railway vehicle (31).

14. A railway vehicle, wherein it is provided with the arrangement according to claim 1.

\* \* \* \* \*